United States Patent [19]

Lumley et al.

[11] Patent Number: 4,636,993

[45] Date of Patent: Jan. 13, 1987

[54] AUTOMATIC GAIN CONTROL FOR SEISMIC DATA

[75] Inventors: Edward M. Lumley, Garland; Bonita F. Bowman, Arlington, both of Tex.

[73] Assignee: Mobil Oil Corporation, New York, N.Y.

[21] Appl. No.: 658,256

[22] Filed: Oct. 5, 1984

[51] Int. Cl.$^4$ .................................................. G01V 1/36
[52] U.S. Cl. ........................................ 367/65; 367/38; 367/47
[58] Field of Search ................ 367/65, 66, 67, 47, 367/900, 38; 73/900

[56] References Cited

U.S. PATENT DOCUMENTS

| | | | |
|---|---|---|---|
| 2,395,481 | 2/1946 | Hoover, Jr. ............................ | 367/65 |
| 3,283,296 | 11/1966 | Newton et al. ...................... | 367/65 |
| 3,296,588 | 1/1967 | Hawkins ............................... | 367/65 |
| 3,924,260 | 12/1975 | Braham et al. ...................... | 367/67 |
| 4,344,158 | 8/1982 | Landrum, Jr. et al. ............. | 367/47 |

Primary Examiner—Thomas H. Tarcza
Assistant Examiner—Ian J. Lobo
Attorney, Agent, or Firm—Alexander J. McKillop; Michael G. Gilman; Charles J. Speciale

[57] ABSTRACT

An improved apparatus and method for calculating automatic gain correction to be applied to seismic samples is disclosed which features apparatus and method for calculation of the average absolute value of a window of samples in the vicinity of the sample being processed, the calculation being performed a first time with the window shifted toward a first side of the sample and a second time with the window shifted toward a second side of the sample, and selecting for use in gain correction the minimum of the two calculated average absolute values, such that high amplitude samples in the vicinity of relatively low amplitude events is precluded from causing unrealistic shadowing around such events.

4 Claims, 14 Drawing Figures

AUTOMATIC GAIN CONTROL FOR SEISMIC DATA

FIELD OF THE INVENTION

This invention relates to processing of seismic data used in the search for oil, gas and other valuable minerals. More particularly, the invention relates to improved methods for automatic gain control of seismic data, by use of which the data can be more accurately interpreted.

BACKGROUND OF THE INVENTION

It is commonplace in the field of exploration for oil, gas and other minerals to use seismic techniques, in which a burst of acoustic energy is imparted to the earth or sea at a "shot point". The acoustic energy travels through the earth, including the ocean, and is reflected at the interfaces between rock layers of varying density to be returned back upwardly to the surface of the earth. Its arrival can be detected by an acoustic microphone, typically referred to as a geophone in earth-based processing and as a hydrophone in water-based prospecting.

Due to the spherical dispersion of the acoustic wave as it travels through the earth, the further the wave travels into the earth before it is reflected back upwardly, the more faintly it is detected upon its eventual arrival at a detector. Additionally, the presence of strongly reflecting rock layers interspersed with more weakly reflecting beds leads to substantial differences in the strength of the detected signals. For these reasons, the art has conventionally applied automatic gain control to the various portions of the seismic signal so that they can be more readily compared to one another, such that distinct events in the fainter portion of the data are not overlooked in comparison to the less attenuated portions. Typically what is done is that a "window" is established, this being a number of samples, e.g. 800 milliseconds long. The data is divided into overlapping windows of this length and the average values or root mean square values of the absolute values of the data in each window are calculated. These average absolute values are used to generate automatic gain control factors, for each window, which are then compared to one another, and can be applied to all of the samples within a given window.

The difficulty with this approach is that high amplitude events within a given window greatly exaggerate the amount of correction to be applied to the other samples in that window, such that a "shadow" effect is observed in the automatic gain control processed data. Relatively faint events within the shadow are thus obscured.

OBJECTS OF THE INVENTION

It is, therefore, an object of the invention to provide an improved automatic gain control apparatus and method for seismic data processing.

It is a further object of the invention to provide an automatic gain control method for seismic data processing according to which shadowing of low amplitude events by higher amplitude events within a given window is substantially avoided, whereby the low amplitude events can more readily be observed.

It is a further object of the invention to provide automatic gain control for processing of seismic data in which shadowing of the data is avoided and in which the overall trend of the data can also be preserved so as to retain the maximum amount of information provided by any given seismic record.

SUMMARY OF THE INVENTION

The present invention satisfies the needs of the art and the objects of the invention mentioned above by its provision of an automatic gain control method and apparatus, in which gain is calculated with respect to windows disposed both above and below a point of interest. The lesser of the two gain values is then used to modify the input signal. In this way, the shadow effect is reduced to a minimum.

This technique can be combined with other processing features shown in co-pending applications, such as the trend preservation discussed in commonly assigned Ser. No. 569,829, filed Jan. 11, 1984 for further improvements.

BRIEF DESCRIPTION OF THE DRAWINGS

The invention will be better understood if reference is made to the accompanying drawings, in which:

FIG. 13 comprising

DESCRIPTION OF THE PREFERRED EMBODIMENT

Figure 1:
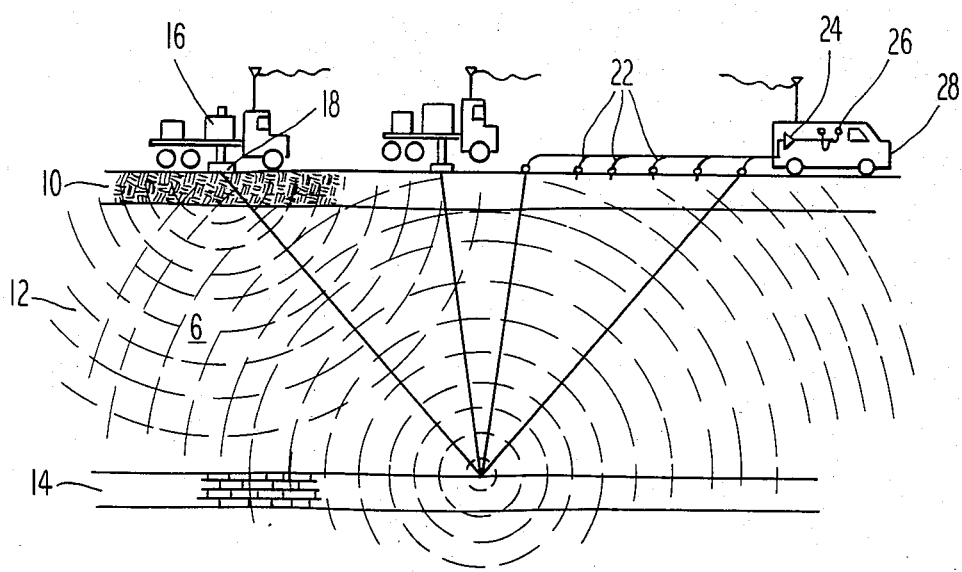
FIG. 1 shows seismic exploration operations generally.

FIG. 1 shows typical seismic exploration operations in schematic form. A source of seismic energy 16, typically a truck having a mechanically vibratable plate upon which the entire truck may be raised, transmits seismic energy indicated generally at 6 into the earth through various layers 10, 12, and 14. At the interfaces between rock layers of varying density and acoustic velocity, such as that between layers 12 and 14, the seismic energy is reflected back upwardly and can be detected by a number of detectors 22 connected by a cable to amplifying and recording devices 24 and 26 carried within a second truck 28 for subsequent analysis.

Those skilled in the art will recognize that as the seismic energy 6 travels through the earth, it is attenuated due to spherical divergence as well as due to reflection at the interfaces and the like. Accordingly, it is conventional in the art to perform gain equalization, generally referred to as automatic gain control (AGC), on the seismic data such that the amplitudes of the various portions of the recorded seismic signal are more directly comparable.

According to the prior art, a gain function g is defined by equation (1):

$$g_i = \frac{1}{L} \sum_{k=i-L/2+1}^{i+L/2} |x_k| \quad i = L/2, N - L/2 \tag{1}$$

Thus, the gain function $g_i$ applied to any given input sample $x_i$ is equal to the average of the absolute values of a number L of samples in a window i of the data, where N is the total number of samples in a given trace. Each sample is thus brought more closely equal to the average of the L samples within that window according to this equation. The process is shown in block diagram form in FIG. 2, where a value $x_i$ corresponding to the amplitude of the ith sample is input. A gain value $g_i$ is calculated as above at 30, and the output amplitude $y_i$ corresponding to the ith sample is simply $x_i$ divided by $g_i$ as shown at 32.

Thus, the prior art method computes a running average of the absolute values of the trace samples $x_i$ over a window of length L centered around the sample $x_i$. These gain values $g_i$ are then divided into the respective samples. Typically, at the start of the trace, the window length is typically reduced to half its selected length L and is increased by one sample per iteration until it is fully meshed with the data. This corresponds to adding zeros to the start of the trace in equation 1 and normalizing by the number of non-zero values. At the end of the trace, a similar problem occurs but in this case the computation stops when the window no longer fits the data, and the last computed gain value is then simply applied to the remainder of the trace values.

Figure 7:
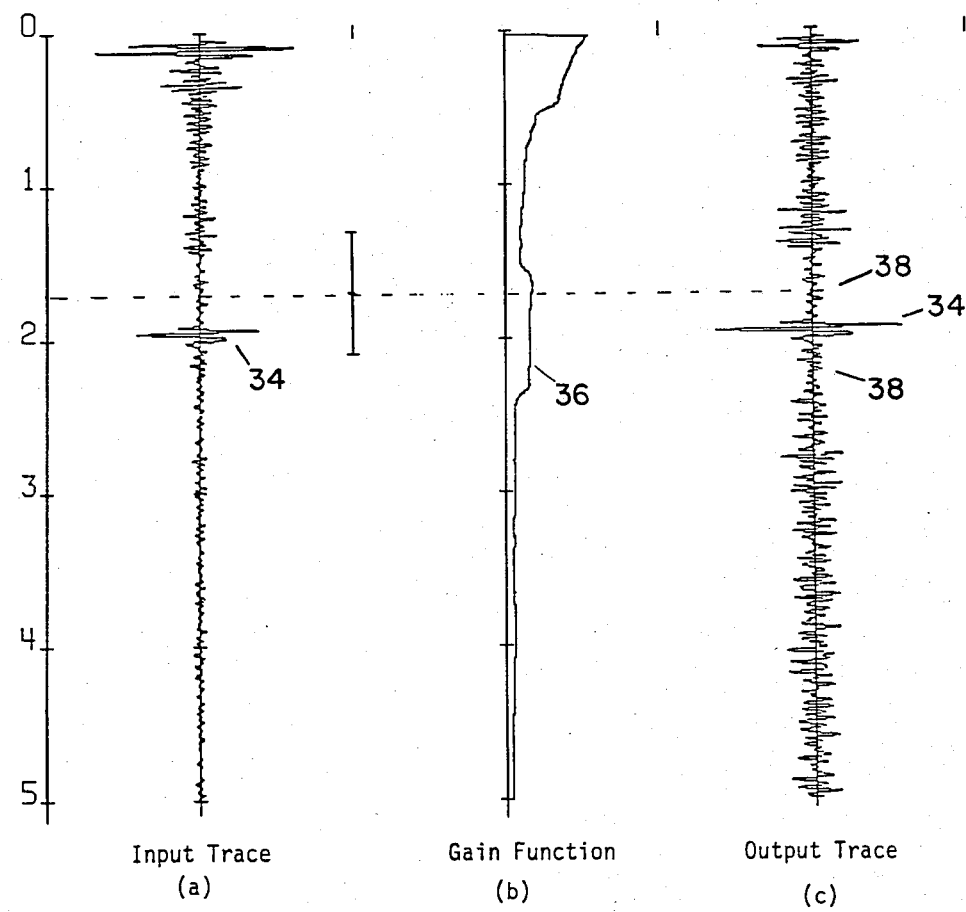
FIG. 7 shows operation of the prior art automatic gain control processing with respect to a single trace.

FIG. 7 illustrates this process on a single seismic trace. Here the output of a single geophone 22 (FIG. 1) is graphed versus time in seconds as the input trace, FIG. 7(a). The gain function $g_i$ is computed according to equation (1), as defined above, and is shown in FIG. 7(b). Here the window L is 800 milliseconds (ms) long. The output trace FIG. 7(c) shows the effect of applying automatic gain control as defined by equation 1. The high amplitude event 34 occurring at about 2 seconds causes the gain function to increase by a substantial factor about a window of length L centered on the high amplitude event. Accordingly, the data around the high amplitude event 34 is unrealistically distorted by division by the relatively high value of g calculated in accordance with equation 1 where the high amplitude event 34 is in the window. That is to say, the data 38 on either side of the high amplitude event 34 in the output trace of FIG. 7(c) is shown having been compressed unrealistically. What is shown, of course, is the intuitive result; the shadows shown at 38 of unrealistically low amplitude output data are simply caused by the inability of the gain function g to change as abruptly as the data. Low amplitude events therefore become lower due to the influence of the high amplitude event 34. On the other hand, perfect adaptability of the automatic gain control function would not be useful either, because this would call for a one-sample wide window which would adapt perfectly but would produce a trace carrying no more information than the sign of the data, destroying the desired shape detail.

Figure 5:
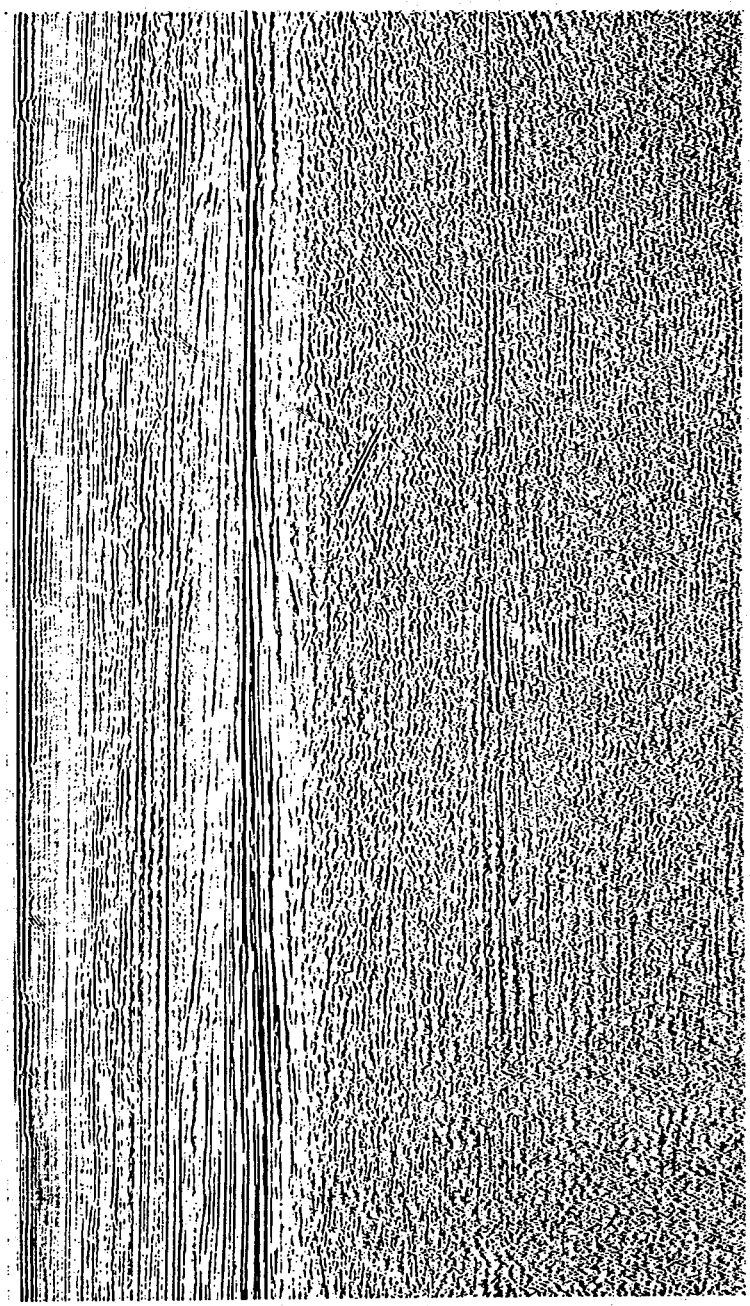
FIG. 5 shows an example of actual seismic data processed according to the prior art method of FIG. 2.
Figure 8:
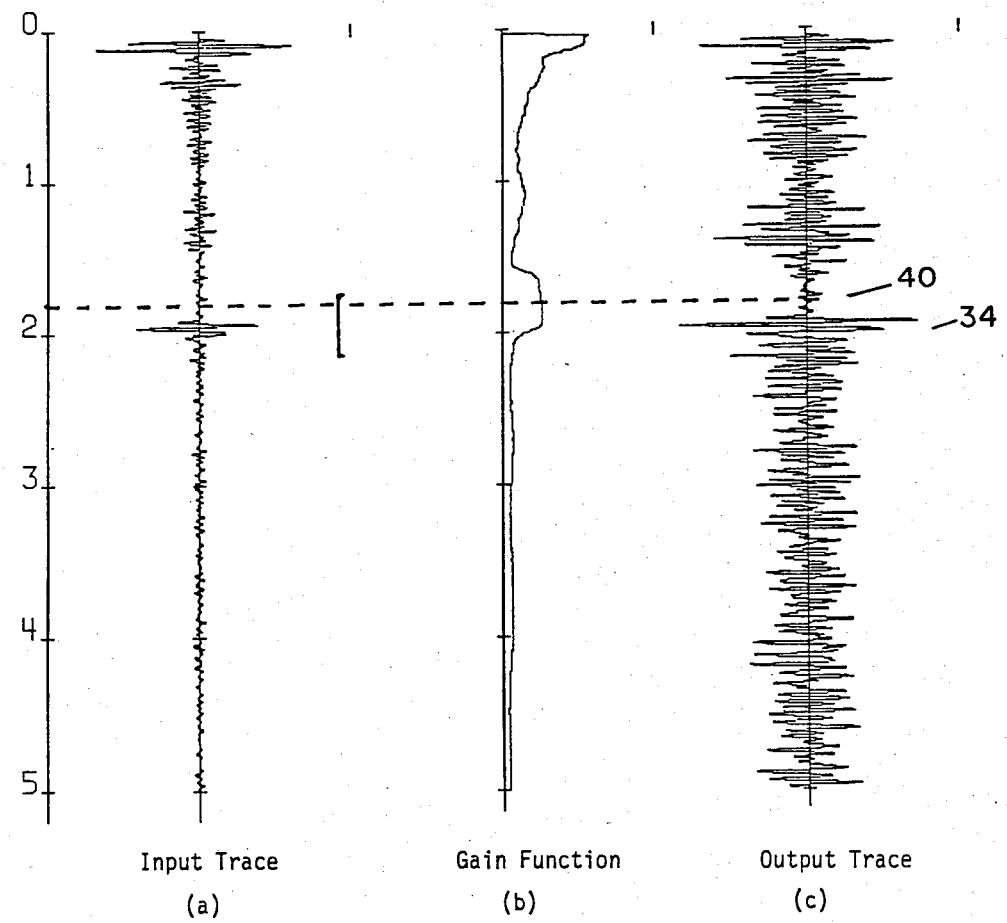
FIGS. 8 and 9 show the effect of displacement of the automatic gain control window before and after a given point of interest in the data.

The input trace of FIG. 7 is selected from an entire input trace which is shown as FIG. 5. This is a record derived from a large number of traces shot along a line. This particular exploration was performed on and beneath the sea bed but this is not critical to the method of the invention. The seismic event of chief interest lies below the high amplitude event which is centered roughly at about 2 seconds deep in the trace, that is, about one third of the way down the section. Accordingly, if it is necessary to have a shadow, as discussed above in connection with FIG. 7, it would be preferable to have the shadow only above the event 34. This would be possible if the gain value $g_i$ were calculated with respect to a sample $x_i$ located near the start of the window rather than at its center. The gain function would then be defined by equation (2) as seen below:

$$g_i(L, B) = \frac{1}{L} \sum_{k=i-B+1}^{k=L-B+i} |x_k| \quad i = B, N - L - B \tag{2}$$

where B is the application sample number, that is, B is a measure of the offset from the lower edge of the window with respect to the sample of interest $x_i$. (B of course is less than L/2.) The results of using this process are shown in FIG. 8. As can be seen, the shadow still exists above the high amplitude sample 34 as at 40. Hence, the next step is to remove the shadow above the window; that is, offset the widow towards its bottom. In this case, the application sample number is effectively L-B, as defined by equation (3).

$$g_i(L, L - B) = \frac{1}{L} \sum_{k=i-L+B+1}^{k=i+B} |x_k| \quad i = L - B, N - B \tag{3}$$

Figure 9:
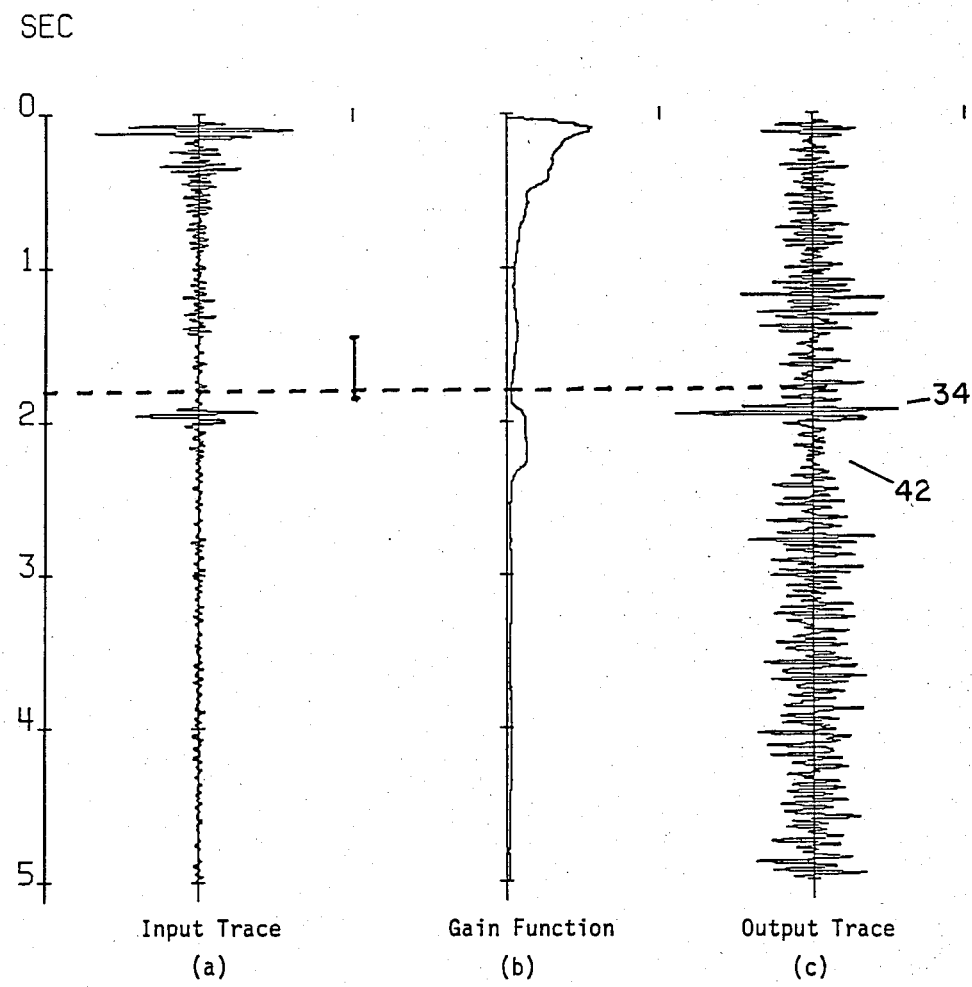

FIG. 9 shows the result; the shadow 42 now appears below the high amplitude event 34.

According to the present invention, the solution to the shadow problem lies in the observation that one should use the gain function resulting in the display of in FIG. 8 below 2 seconds and that shown in FIG. 9 above 2 seconds, and in the further observation that the desired gain function in both cases is the minimum of the two functions, i.e., the lesser of the two functions. Accordingly, the best of both approaches can be realized by computing $g_i$ for the sample $x_i$, offset first above and then below the center of the window, and selecting the minimum value for each $g_i$ such that the minimum correction is applied to low amplitude events around the high amplitude event 34.

Figure 2:
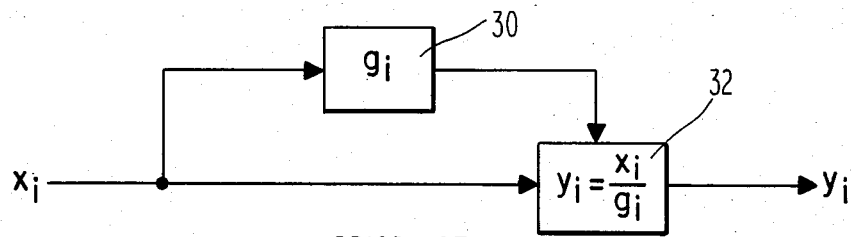
FIG. 2 shows the prior art automatic gain control gain function.
Figure 3:
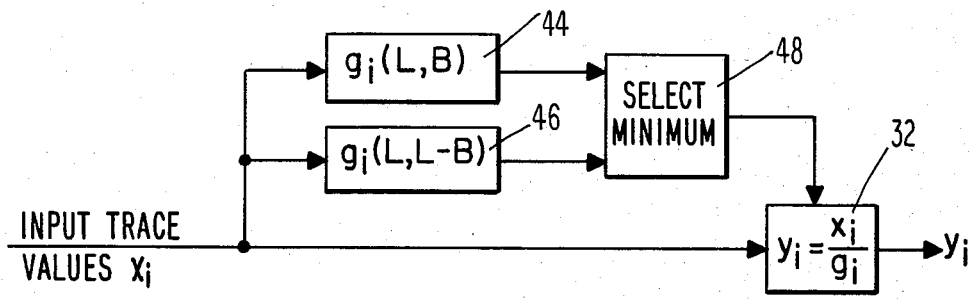
FIG. 3 shows the improved automatic gain control function as proposed hereby.

FIG. 3 shows a block diagram corresponding to FIG. 2 of the process of the invention. Input values $x_i$ are input to two functions 44 and 46, in which $g_i$ is calculated with respect to windows of length L, with the sample $x_i$ offset by B and L-B respectively. The minimum value for $g_i$ computed in these two processes 44 and 46 is selected at 48 and output for calculation of $y_i$ at 32; as in FIG. 2, $y_i$ is simply $x_i$ divided by $g_i$. $g_i$ is the minimum of $g_i(L,B)$ and $g_i(L,L-B)$. The results are shown with respect to a single trace in FIG. 10. The shadow in the gain function is reduced to a relatively small bump 50 corresponding to the relatively high amplitude event 34, and the effect of two shadows is greatly reduced on the output trace of FIG. 10(c).

Figure 6:
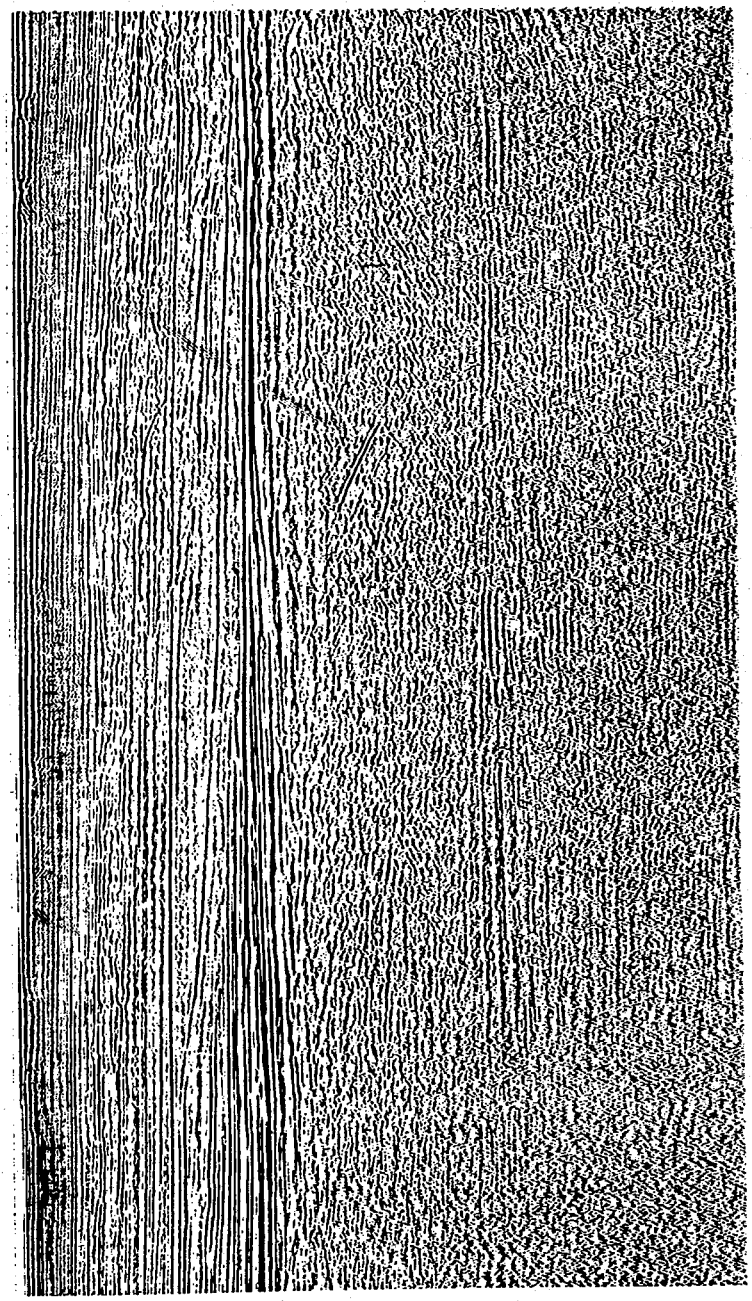
FIG. 6 shows the same data as in FIG. 5, but processed according to the present invention.

The seismic data of the complete line processed according to the prior art described by Equation (1) and shown in FIG. 5 when reprocessed according to the invention as described in connection with FIG. 3 results in the seismogram of FIG. 6. It will be appreciated that the data both above and below the high amplitude event centered around 2 seconds is much more clear and easily readable than in the version processed according to the prior art of FIG. 5.

Figure 10:
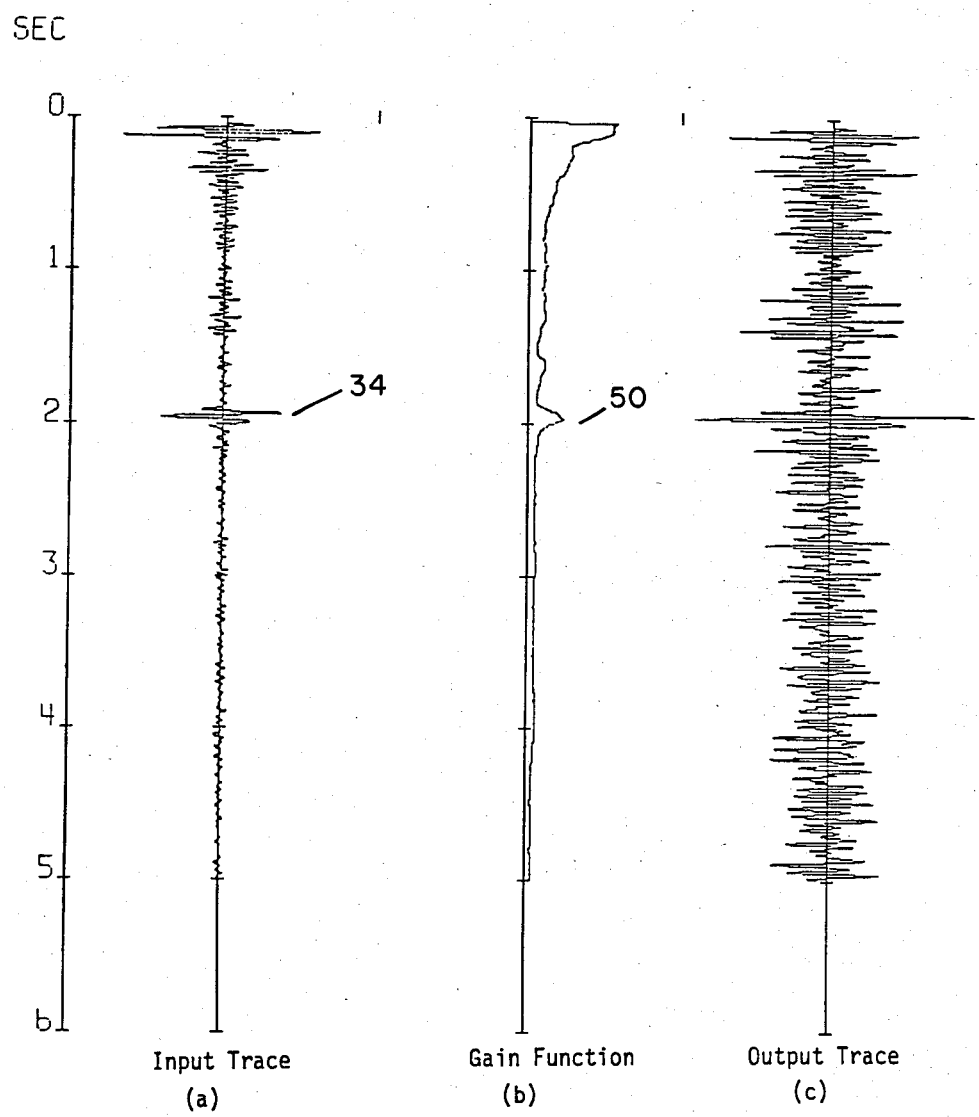
FIG. 10 shows the selection and optimization thereof as performed according to the invention, again on a single trace.
Figure 11:
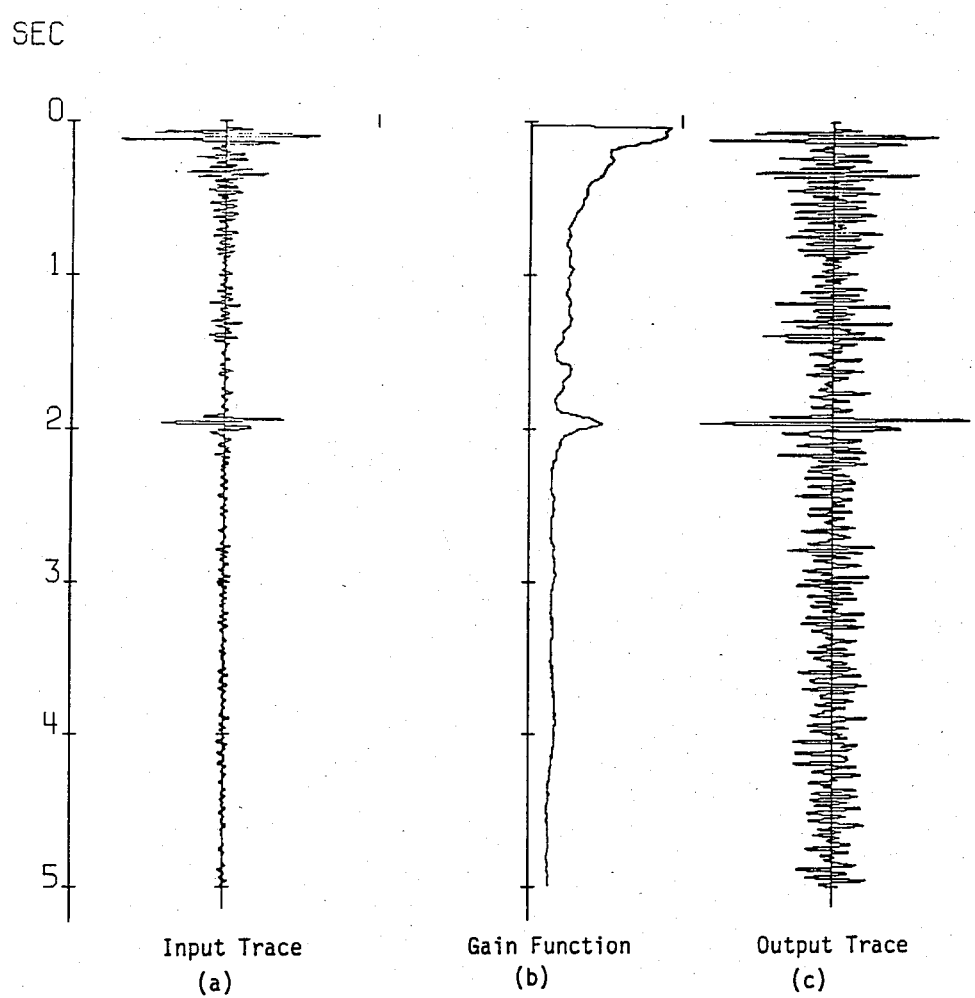
FIG. 11 shows use of the method of the invention combined with trend retention, for further clarity.

Those skilled in the art will recognize that the single trace shown in FIG. 10 does not appear to contain much if any useful information in the last few seconds of the input data shown in FIG. 10(a). This data when equalized according to the invention results in the output trace of FIG. 10(c) which appears to contain meaningful information. In order to avoid this possibly misleading portrayal, one can also incorporate what may be referred to as gain reduction or trend retention. An additional trend retention parameter p can be incorporated into the method described in connection with FIG. 3 by taking the pth root, p being selected by the operator, of the gain function, which tends to weaken the equalizing effect of the gain function by allowing strong trace amplitudes to remain stronger than weaker amplitudes, i.e. the amount of dynamic range reduction will be greatest for p=1. FIG. 11 shows the data of FIG. 10 with the trend retention parameter p set equal to 0.75. The use of the parameter p in trend preservation of automatic gain control process seismic data is more fully discussed and claimed in commonly assigned copending Ser. No. 569,829 filed Jan. 11, 1984.

As discussed above, in the prior art, automatic gain control is usually applied to the initial samples of a seismic trace by tapering the window, that is, using fewer samples to calculate the gain control factor towards the beginning of the trace. This tends to fail to equalize the initial samples, which because they are the first received have the highest amplitude. Instead the initial non-zero samples can be considered to be equivalent to a deep event. To simulate such a situation, a "folding" process can be used, selecting values from the trace after the initial high amplitude portions and supplying these to the "other side" of the initial window, including the high amplitude portions, for automatic gain correction of the initial samples. The process employed seeks the occurrence of the maximum absolute amplitude within the first 25 samples or within a selected window length, whichever is smaller. This maximum amplitude is assumed to lie on the strong event and its location is used to define the location of a "strong reflector". This sample is the "folding sample", and its location is set equal to J samples from the first non-zero sample. By folding this trace about the Jth sample, weak events which follow the strong event are used to extend the data earlier in time, i.e. to provide realistic amplitude data for use in the windows used for calculation of g to be applied to the first few samples. In one successfully tried implementation, the folded data is used prior to the first non-zero sample to preserve the non-zero data prior to the Jth sample. This amounts to extending the trace backwards from the first non-zero sample starting with the 2*Jth sample.

Figure 12:
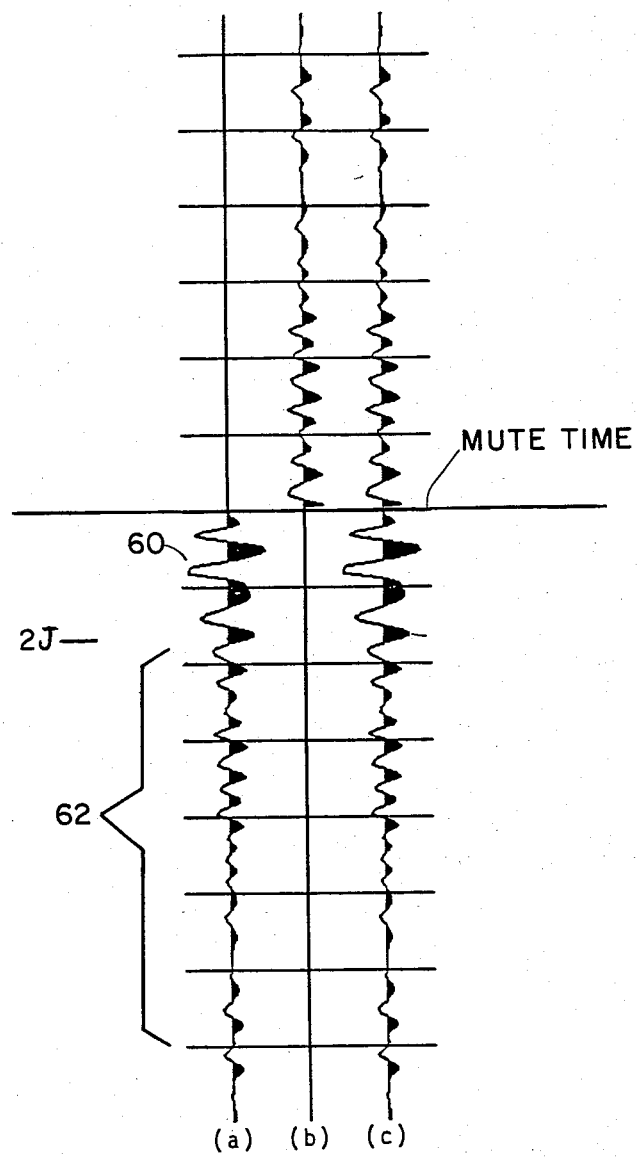
FIG. 12 shows a folding process which can be used to supply samples to the early part of the data trace so as to obtain proper correction.

FIG. 12 shows this process schematically. In FIG. 12(a) a sample trace is shown. The highest amplitude sample is shown at 60; this is the Jth sample. The data occurring after sample 2J, shown at 62, is "folded" as in FIG. 12(b) prior to the mute time, i.e. prior to the first non-zero sample in the trace of FIG. 12(a). The two are then summed to generate a composite trace shown in FIG. 12(c) having the same data on either side of the mute time and the 2Jth sample, so that the automatic gain control correction applied to the samples up to 2J according to Equation (2) are such as to lead to realistic results.

Figure 13A:
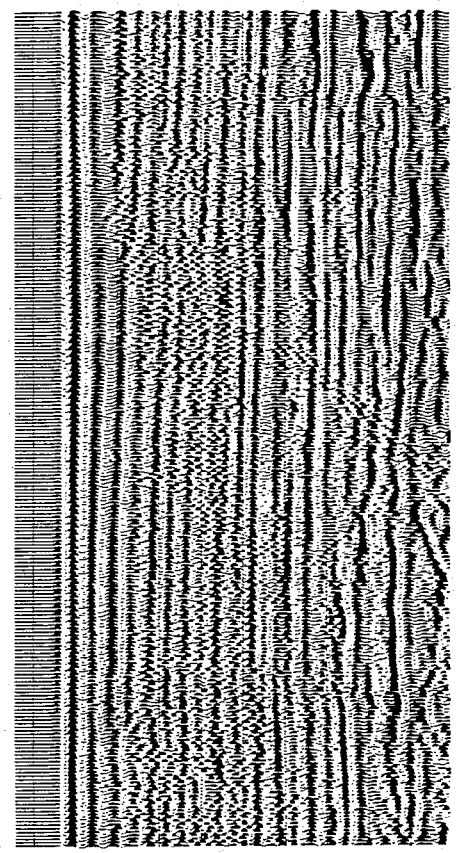
FIGS. 13a and 13b, shows the result of the techniques discussed in connection with FIG. 12.
Figure 13B:
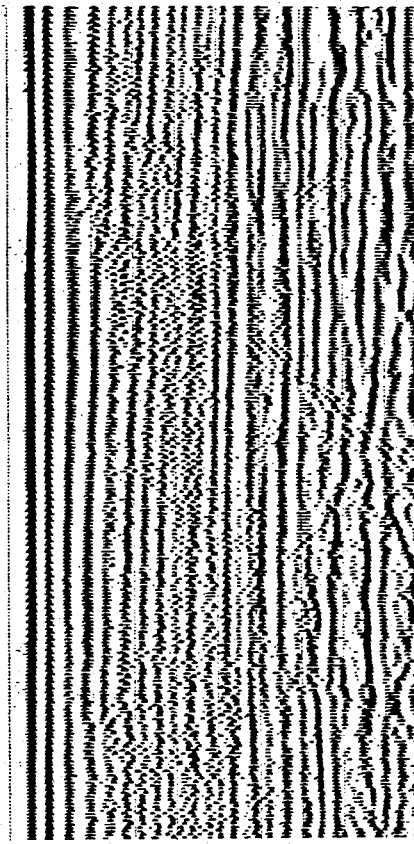

FIG. 13 shows results of applying this folded window technique, used in connection with automatic gain control according to the invention, as compared with the tapered window technique used in the prior art and discussed above. FIG. 13(a) shows the folded window technique for equalizing the initial amplitudes and FIG. 13(b) shows the prior art tapered window technique. It can, of course, be argued as to which is more meaningful in terms of the actual geophysical structure of the earth being considered, but for display purposes, the folded window technique is considered to provide a more consistent gain value computation without sacrifice of the clean line of the water bottom reflection.

Figure 4:
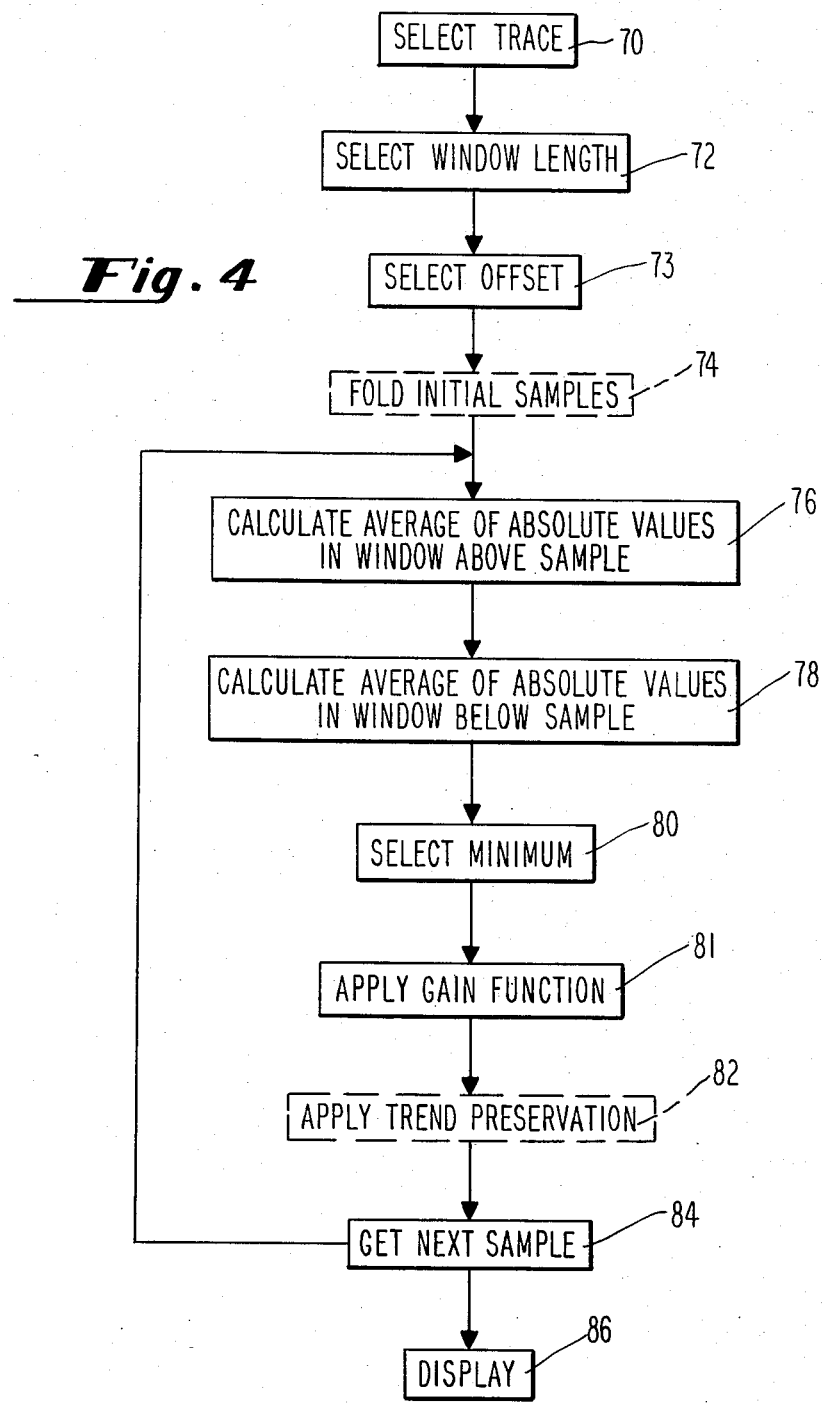
FIG. 4 shows a flow chart of operations undergone in automatic gain control seismic data processing hereunder.

FIG. 4 shows generally the steps in seismic data processing according to the invention. A trace to be processed is selected at 70, and an initial window length L is selected at 72. An initial offset b is selected at 73. If the folding process discussed in connection with FIG. 12 is desired, this is implemented at 74. One then calculates the average of the absolute values in the window offset by B above the sample at 76, then the average of the absolute values in the window offset by B below the sample at 78. The minimum value for g calculated thereby is selected at 80, and the gain function g is applied at 81. Trend preservation is applied at 82, if desired, in accordance with the discussion referring to FIG. 11. The next sample is similarly processed at 84; finally, when all the data has been processed, the output is displayed as at 86.

It will be appreciated that there has been described a method for improved automatic gain control of seismic data which is readily implementable and which causes minimal additional complexity in processing operations.

It will also be appreciated that for constant B the lower window for one sample on a given trace will include the same data as the upper window for another, and that by appropriate programming the actual calculation of g need not be repeated.

While a preferred embodiment of the invention has been described above, it will be recognized that additional improvements can be made, particularly in the area of applying additional corrections and processing modifications to the method of the invention. Accordingly, the invention should not be construed to be limited by the above disclosure, which is merely exemplary, but only by the following claims.

We claim:

1. The method of applying automatic gain control to seismic data in the form of a series of samples, comprising the steps:

selecting a window length for automatic gain control processing, said window length comprising a plurality of said samples, and for each respective one of said samples, calculating the average of the absolute values of the amplitudes of the ones of said samples in a first window of said data, said first window having said length and being disposed in a first time relationship to a respective one sample whereby said sample is within said window and is offset above the center of said window;

calculating the average of the absolute values of the amplitudes of the ones of said samples in a second window of said data, said second window having said length and being disposed in a second time relationship to said respective one sample whereby said respective one sample is within said window and is offset below the center of said window;

selecting the minimum of said average amplitude values as a gain control factor to be applied to said respective one sample; and dividing said respective one sample by said gain control factor, to apply automatic gain control to said respective one sample.

2. A method for providing automatic gain control to individual ones of a series of amplitude samples representing a seismic signal, comprising the following steps for each one of said samples:

evaluating the average absolute value of the samples of a first portion of said series of samples defined by a window of given length and comprising a said one of said samples:

wherein said first portion is positioned relative to said one sample so that said one sample is positioned within the first half of said first portion of said series of samples;

similarly evaluating the average absolute value of the samples of a second portion of said series of samples defined by a window of said same length and comprising said one sample;

wherein said second portion is positioned relative to said one sample so that said one sample is positioned within the second half of said second portion of said series of samples;

selecting the lesser of said two average values thus obtained; and dividing said one sample by said lesser of the two average values thus obtained, to provide automatic gain control to said one sample.

3. The method as described in claim 2, comprising carrying out said steps for each sample of said series, whereby automatic gain control is provided to the entire series.

4. A system for processing seismic data having apparatus for providing automatic gain control to each one of a series of sample signals representing a seismic signal, comprising first gain means for generating a first gain factor to be applied to a said one sample signal, said first means having means for processing a plurality of sample signals within a first window of a first length and shifted in a first time direction from said one sample signal so that said one sample signal is within the first half of the sample signals within said first window, second gain means for generating a second gain factor to be applied to said one sample signal, said second means having means for processing the sample signals within a second window of said first length and shifted in a second time direction from said one sample signal, so that said selected signal is within the second half of the sample signals within said second window; and output means for selecting the minimum of said two gain factors and dividing said one sample signal by said selected gain factor to provide an output sample signal, whereby each said sample signal amplitude is automatically gain controlled.

* * * * *